United States Patent [19]

Okuzawa

[11] Patent Number: 5,080,346
[45] Date of Patent: Jan. 14, 1992

[54] PICTURE RECORDING APPARATUS

[75] Inventor: Tugio Okuzawa, Kanagawa, Japan

[73] Assignee: Fuji Photo Film Co., Ltd., Kanagawa, Japan

[21] Appl. No.: 552,379

[22] Filed: Jul. 13, 1990

Related U.S. Application Data

[63] Continuation of Ser. No. 228,143, Aug. 4, 1988, abandoned.

[30] Foreign Application Priority Data

Aug. 5, 1987 [JP] Japan .................................. 62-194520

[51] Int. Cl.⁵ .......................... B65H 7/02; B65H 5/02; G03B 29/00
[52] U.S. Cl. ..................................... 271/258; 271/274; 355/28; 226/108
[58] Field of Search ............... 271/258, 265, 272, 273, 271/274; 226/108, 186, 187; 355/13, 50, 51, 64, 27-29; 83/649

[56] References Cited

U.S. PATENT DOCUMENTS

| | | | |
|---|---|---|---|
| 2,632,641 | 3/1953 | Rice | 271/273 X |
| 2,995,363 | 8/1961 | Pittwood | 271/273 |
| 3,325,071 | 6/1967 | Schmitz | 226/108 X |
| 3,532,338 | 10/1970 | Brinson et al. | 271/273 X |
| 3,682,543 | 8/1972 | Iwamoto | 355/13 |
| 3,884,103 | 5/1975 | Namba | 83/649 |
| 4,017,169 | 4/1977 | Komura et al. | 271/273 X |
| 4,385,537 | 5/1983 | Wolf | 271/273 X |
| 4,484,070 | 11/1984 | Inoue | 271/258 X |
| 4,558,373 | 12/1985 | Plasencia et al. | 271/273 X |
| 4,607,836 | 8/1986 | Miyasaka | 271/272 |
| 4,681,313 | 7/1987 | Yokohama et al. | 271/273 |
| 4,809,049 | 2/1989 | Okuzawa et al. | 355/28 |

FOREIGN PATENT DOCUMENTS 2017655A 10/1979 United Kingdom ................ 271/273

OTHER PUBLICATIONS

IBM Technical Disclosure Bulletin, vol. 14, No. 10, 3/72, Double Pressure Roll Select Assembly, Green et al., pp. 3139-3140.

Primary Examiner—Michael S. Huppert
Assistant Examiner—Kenneth DeRosa
Attorney, Agent, or Firm—Sughrue, Mion, Zinn, Macpeak & Seas

[57] ABSTRACT

A picture recording apparatus such as may be used with a rolled sheet material in which marks on finished pictures due to pressure exerted on the recording material by conveying rollers when the apparatus is in the stopped state are eliminated. When picture recording operations are to be carried out, multiple pairs of conveying rollers are engaged with one another to convey the recording material through various processing stations. When picture recording operations are halted, such as when the apparatus is turned off, at least one of the conveying rollers which would cause marking of finished pictures are disengaged from one another.

6 Claims, 3 Drawing Sheets

PICTURE RECORDING APPARATUS

This is a continuation of application no. 07/228,143 filed Aug. 4, 1988, now abandoned.

BACKGROUND OF THE INVENTION

The present invention relates to a picture recording apparatus using a rolled sheet material.

A wide variety of picture recording apparatuses have been proposed and employed in the art. For example, a picture recording apparatus, as disclosed in commonly assigned Japanese Unexamined Patent Publication No. 61-275742 uses a photosensitive and pressure-sensitive material constituted by a support coated with photosensitive components including at least photosensitive silver halide, a reducing agent, a compound which can be polymerized (hereinafter referred to as a polymerizable compound) and a color-picture forming substance. At least the polymerizable compound and the color-picture forming substance are enclosed within the same microcapsules. A method for recording a picture using such a material is disclosed in Japanese Unexamined Patent Publication No. 61-278849.

In an apparatus utilizing this picture recording method, as shown in FIG. 4, a photosensitive material S drawn out of a magazine 4 is exposed with light carrying an image of a picture (hereinafter referred to as "image carrying light") by an exposure portion 3 so that a latent image is formed on the material S. Then, the photosensitive material S is developed by a heat-developing device 12 so that the polymerizable compound is polymerized to a high molecular compound so as to harden the microcapsules in positions corresponding to the picture image. Next, the photosensitive material S is placed on a picture receiving material C having a picture receiving layer to which the color-picture forming matter can be transferred at a superimposing position portion 19. The stack of the photosensitive material S and the picture receiving material C is pressed by a pressing-transferring device 22 so that at least a portion of the microcapsules in positions where the latent image does not exist are ruptured so that the color-picture forming matter is transferred to the picture receiving material C to thereby obtain a picture on the picture receiving material C.

In the apparatus using such a rolled sheet material as described above, it is necessary that a certain length of photosensitive material remain in a conveying path between the magazine 4 and the exposure portion 3 even during stoppage of picture recording because the photosensitive material S must be drawn out of the magazine 4 and then conveyed.

If the period of stoppage of picture recording or the period during which the apparatus is not used is long, the same fed-out portion of the photosensitive material S is held in a pressed state by conveying rollers for a long time. When a picture is subsequently recorded on the photosensitive material, marks from the rollers appear in the picture recorded on the first sheet, resulting in unevenness in the picture.

SUMMARY OF THE INVENTION

An object of the present invention is therefore to solve the foregoing problem.

Specifically, an object of the present invention is to provide a picture recording apparatus in which no marks from conveying rollers are left on the picture recording sheet material.

In order to attain the above and other objects, according to the present invention, a picture recording apparatus using a rolled sheet material is provided which comprises pairs of conveying rollers arranged to sandwich the rolled sheet material fed thereto so as to stop the sheet material at a predetermined position, and roller moving means for moving the rollers in a direction so as to release the pressure urging rollers in each pair against each other.

The roller moving means is operated in accordance with the conditions of the picture recording operation in such a manner that the pressure urging rollers in each pair against each other is applied to each pair of the conveying rollers during a picture recording operation and when the power source is in its "ON" state, while the conveying rollers are moved by the roller moving means in a direction to release the pressure urging the rollers in each pair against each other during stoppage of picture recording or when the power source is in its "OFF" state.

The present invention can be applied to any picture recording apparatus so long as it uses a rolled sheet material, for example, a pressure-sensitive rolled sheet material, a thermo-sensitive rolled sheet material, or the like.

The operation of the foregoing roller moving means may be automatically controlled on the basis of an operational signal of the picture recording apparatus.

BRIEF DESCRIPTION OF THE DRAWINGS

The present invention will be apparent from the following detailed description taken in conjunction with the accompanying drawings, in which.

DESCRIPTION OF THE PREFERRED EMBODIMENTS

A preferred embodiment of a picture recording apparatus constructed according to the present invention will be described with reference to the accompanying drawings.

Figure 1:
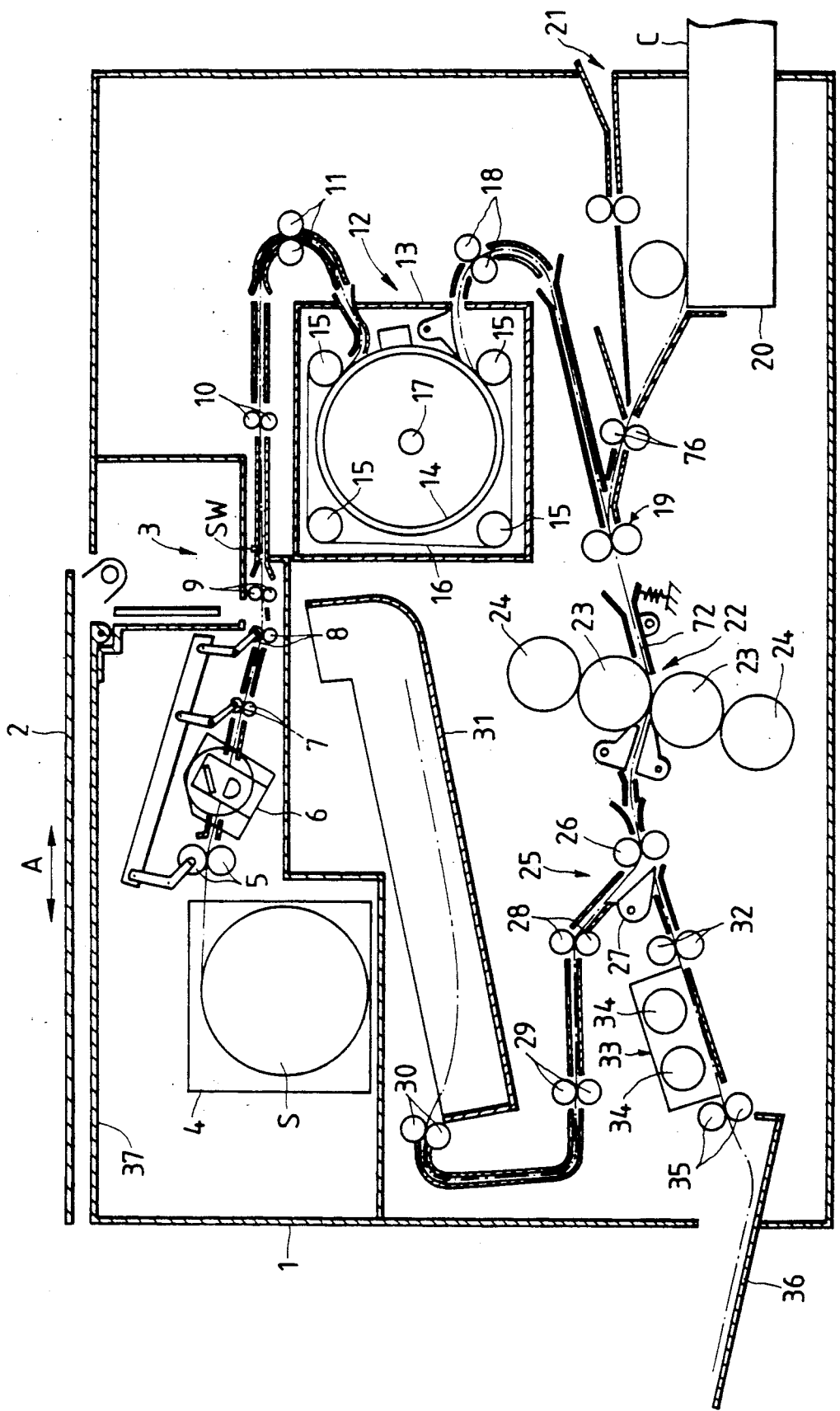
FIG. 1 is a schematic view showing a preferred embodiment of a picture recording apparatus according to the present invention.

FIG. 1 is a longitudinal sectional view showing a picture recording apparatus according to the present invention.

A transparent supporting plate 2 made of glass for holding a document thereon is provided on the upper surface of a housing 1, and an exposure device 3 is provided below the glass plate 2. The exposure device 3 is fixed in the housing 1, and the glass plate 2 is arranged to be horizontally reciprocated above the exposure device 3 by a drive device (not shown), that is, in the direction of an arrow A in the drawing.

A photosensitive material S is housed in a rolled state in a magazine 4 and drawn out of the magazine 4 by a pair of feed-out rollers 5. Attachment/removal of the magazine 4 is performed after an upper portion cover 37 has been opened by rotation about its right end in the drawing. The photosensitive material S drawn out of the magazine 4 is conveyed to an exposure portion by conveying rollers 7, 8, and 9 and cut to a predetermined length by a cutter 6 while being exposed.

The sheet-like cut photosensitive material S carrying an exposed image is further conveyed into a heat-developing device 12 by conveying rollers 10 and 11.

The heat-developing device 12, which is mounted in a thermally insulated housing 13, is provided with a hollow cylindrical heating roller 14, four belt supporting rollers 15, and an endless belt 16 wound around the outer peripheral surface of the heating roller 14 over a rotational angle of about 240 degrees and entrained so as to engage the supporting rollers 15 in such a manner that the photosensitive material S is conveyed while being sandwiched between the belt 16 and the heating roller 14 while being heated to about 120° C. by a halogen lamp 17 provided in the heating roller 14.

The photosensitive material S, heat-developed by the heat-developing device 2, is discharged from the housing 13 and conveyed by conveying rollers 18 to a superimposition portion 19 where the photosensitive material S is superimposed on picture receiving paper C fed from a picture receiving paper cassette 20 or from a manual insertion portion 21. The stack of the photosensitive material S and the picture receiving paper C is conveyed to a pressing-transferring device 22.

The pressing-transferring device 22 is constituted by a pair of pressing rollers 23 urged against each other, backup rollers 24 urged against the corresponding pressing rollers 23, and a blade 72 provided at an inlet portion of the pressure-transferring device 22 for preventing the photosensitive materials S and the picture receiving paper C from crinkling. The forward end of the blade 72 contacts elastically with the pressing roller 23. The stack of the photosensitive material S and the picture receiving paper C is pressed by pressure of about 550 kg/cm². After a picture recorded on the photosensitive material S has been transferred to the picture receiving paper C, the stack of the photosensitive material S and the picture receiving paper C is conveyed to a separation device 25.

The separation device 25 is constituted by conveying rollers 26 and a separating pawl 27, and is arranged such that the separating pawl 27 is swung at the downstream end of the conveying rollers 26 in such a manner that the forward end of the separating pawl 27 is inserted between the photosensitive material S and the picture receiving paper C to thereby separate the photosensitive material S and the picture receiving paper C from each other.

The photosensitive material S separated from the picture receiving paper C by the separation device 25 is conveyed and discharged into a discard tray 31 by conveying rollers 28, 29, and 30. After being separated from the photosensitive material S, the picture receiving paper C having the picture transferred thereto is conveyed to a fixing device 33 by conveying rollers 32. After being irradiated with ultraviolet rays emitted, for example, by ultraviolet lamps 34 provided in the fixing device 33 to fix the picture, the picture receiving paper C is sent to a take-out tray 36 by conveying rollers 35.

Figure 2:
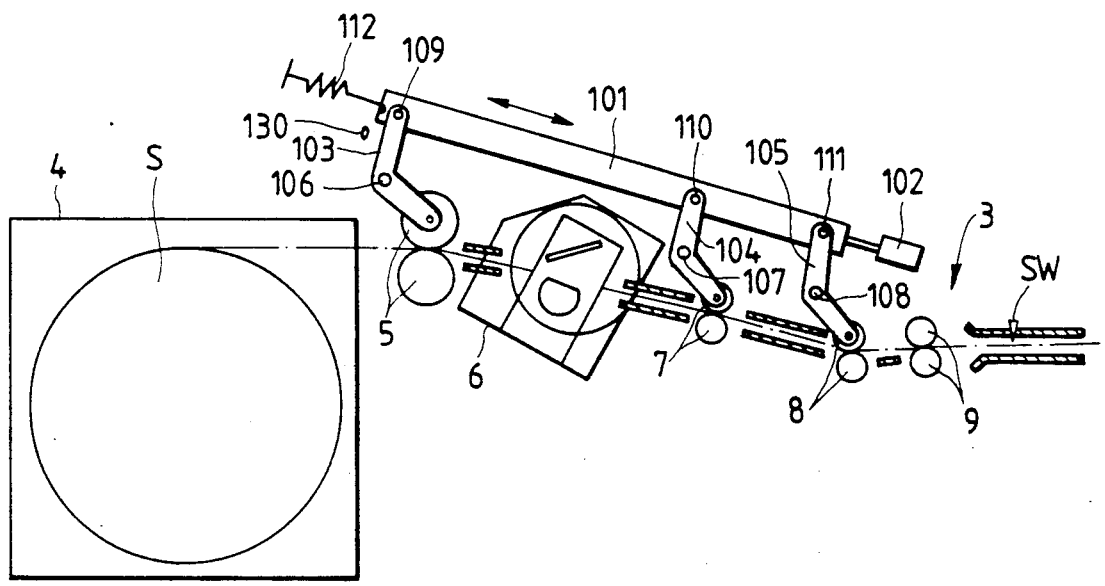
FIG. 2 is a sectional view showing a part of a sheet material conveying path from a magazine.
Figure 3:
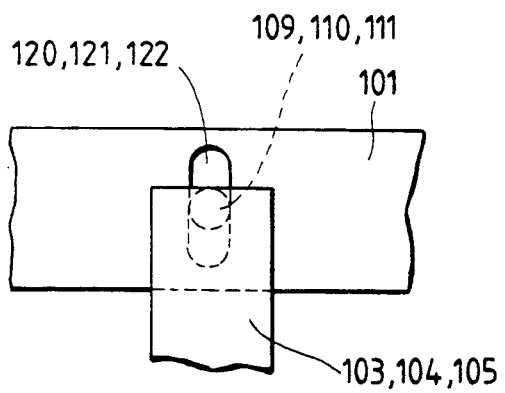
FIG. 3 shows a connection portion between a connection plate and an arm in the apparatus of FIG. 1.
Figure 4:
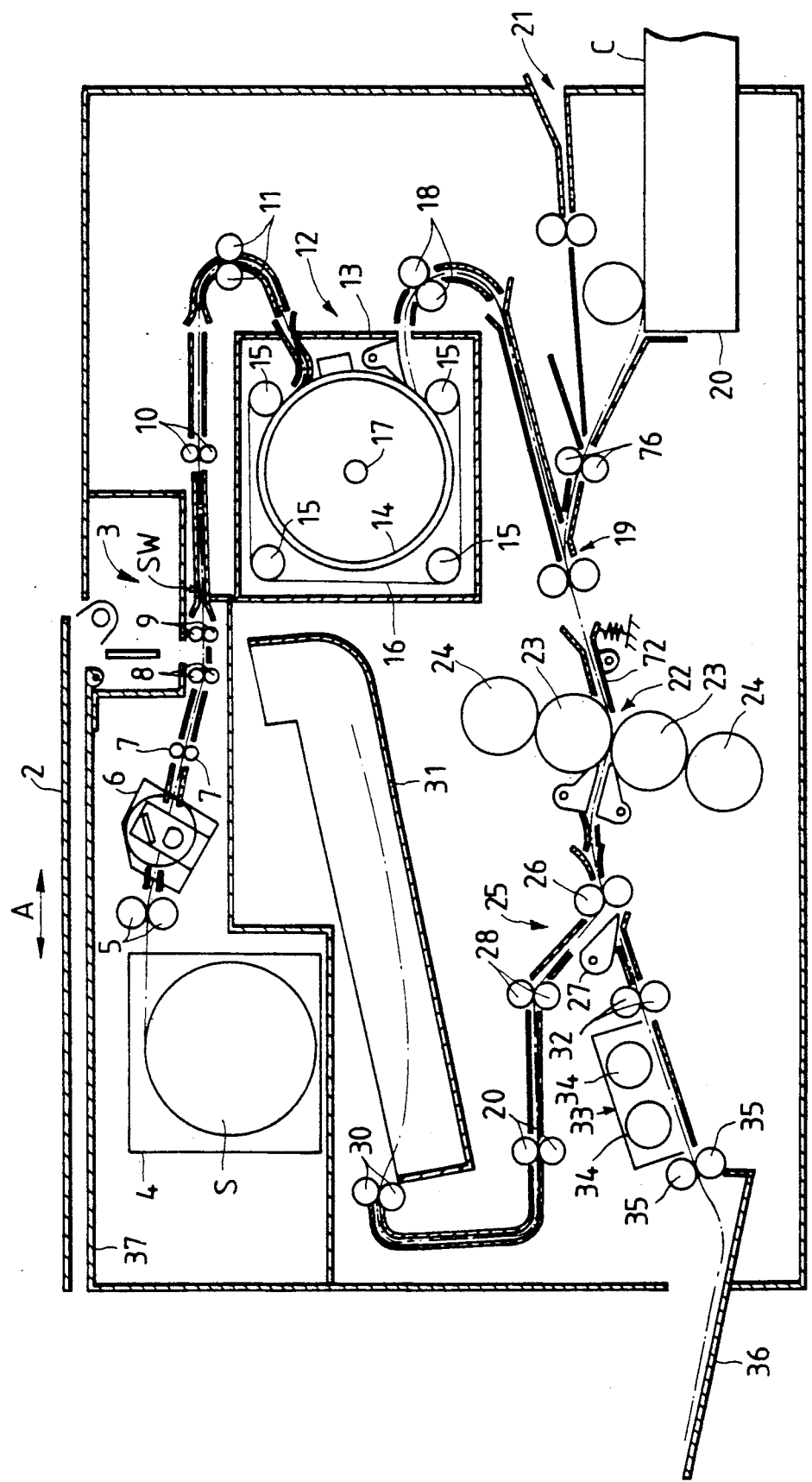
FIG. 4 is a schematic view of a conventional picture recording apparatus.

FIG. 2 is an enlarged sectional view showing a roller moving device constituted by a connection plate and arms provided along the conveying path from the magazine 4 to the exposure portion 3. Substantially L-shaped arms 103, 104, and 105 bent in the same direction are rotatably supported at first ends thereof on a support shaft of one of the pair of feed-out rollers 5, on a support shaft of one of the pair of conveying rollers 7, and on a support shaft of one of the pair of conveying rollers 8, respectively. The arms 103, 104, and 105 are pivotally supported at their bent portions by pivots 106, 107, and 108 respectively, and connected to each other at their respective other ends opposite to the roller side through a connection plate 101. The connection plate 101 is connected at one end to a spring 112 and at its other end to a solenoid 102. As shown in FIG. 3, elongated holes 120, 121, and 122, corresponding to the arms 103, 104 and 105, are formed in the connection plate 101 at connection portions between the connection plate 101 and the respective arms 103, 104, and 105, and pins 109, 110, and 111, respectively provided on the arms 103, 104, and 105, are slidably engaged with the elongated holes 120, 121, and 122.

In this embodiment of a picture recording apparatus, a forward end detection sensor SW is provided downstream of the exposure portion 3 to detect the forward end of the photosensitive material S and stop the same at the position of the sensor SW during stoppage of picture recording.

When the power source of the picture recording apparatus is in its "OFF" state, the solenoid 102 is not energized. The connection plate 101 is therefore pulled by the spring 112 against a stopper 130 to turn the arms 103, 104, and 105 about the respective pivots 106, 107, and 108 to thereby move the feed-out rollers 5 and the conveying rollers 7 and 8 so that the feed-out rollers 5 and the conveying rollers 7 and 8 are held in a state in which the pressure urging the rollers in each pair against each other is released. At this time, the forward end of the photosensitive material S in which no picture is to be recorded is kept sandwiched between the conveying rollers 9 so that no displacement of the forward end of the photosensitive material can occur.

Next, when the power source of the picture recording apparatus is placed in its "ON" state, the solenoid 102 is energized, either directly when the power source is turned ON or when a switch for starting a picture recording operation is turned on, thereby pulling the connection plate 101 to turn the arms 103, 104, and 105, and thus moving the rollers 5, 7, and 8 into a conveyance-enabled stated in which the rollers in each pair are urged against each other.

Although the pressure urging the rollers in each pair against each other is released in the "OFF" state of the power source as described above, an arrangement may be made such that after completion of the picture recording operation the energization of the solenoid 102 is stopped so that the pairs of rollers 5, 7, and 8 are moved to thereby release the pressure urging the rollers in each pair against each other. Further, an arrangement may be made such that the foregoing connection plate 101 is not used and a solenoid is directly connected to each of the arms or the rollers so as to control the rollers with the timing as described above.

According to the present invention, as described above, a conveying roller moving device is provided at a position where feed-out of a sheet material is stopped so that pressure applied against the sheet material is released during the stoppage of picture recording operations. Accordingly, marks from the conveying rollers are prevented from appearing on the recorded pictures.

What is claimed is:

1. A picture recording apparatus using a rolled sheet material, comprising:

a plurality of pairs of conveying rollers disposed upstream of an exposure section and arranged to sandwich said rolled sheet material fed thereto so as to stop said sheet material at a predetermined position, a forward end detection sensor for detecting a forward end of said rolled sheet material, and roller moving means for moving at least some of said rollers in a direction so as to release a pressure for urging said rollers in each pair against each other when said rolled sheet material is stopped in response to said forward end detection sensor, wherein said roller moving means comprises a plurality of pairs of L-shaped arms connected at one end to a roller of each of said rollers to be moved, and a connection plate, the other ends of said arms being commonly connected to said connection plate.

2. The picture recording apparatus according to claim 1, wherein said roller moving means further comprises a solenoid connected to said connection plate a stopper, and a spring connected at one end to said connection plate and at the other end to a fixed point, said spring pulling said connection plate against said stopper when said solenoid is not actuated and said solenoid moving said rollers so that rollers in each of said pairs are urged against one another when said solenoid is actuated.

3. The picture recording apparatus according to claim 1, further comprising at least one pair of conveying rollers disposed downstream of said exposure section, wherein said at least one pair of conveying rollers are not connected to said roller moving means so that said at least one pair of rollers always sandwich said sheet material therebetween.

4. The picture recording apparatus according to claim 1, further comprising means for controlling said roller moving means so that said at least some of said conveying rollers sandwich said sheet material when picture recording is to be carried out, and for operating said roller moving means to release said pressure urging each pair of said at least some conveying rollers against each other when said picture recording is ended.

5. A picture recording apparatus using a rolled sheet material, comprising:

a plurality of pairs of conveying rollers arranged to sandwich said rolled sheet material fed thereto so as to stop said sheet material at a predetermined position, a forward end detection sensor for detecting a forward end of said rolled sheet material, and roller moving means for moving at least two of said rollers in a direction so as to release a pressure for urging said rollers in each pair against each other when said rolled sheet material is stopped in response to said forward end detection sensor, wherein said roller moving means comprises a plurality of pairs of L-shaped arms connected at one end to a roller of each of said rollers to be moved, and a connection plate, the other end of said arms being commonly connected to said connection plate.

6. The picture recording apparatus according to claim 5, wherein said roller moving means further comprises a solenoid connected to said connection plate, a stopper, and a spring connected at one end to said connection plate and at the other end to a fixed point, said spring pulling said connection plate against said stopper when said solenoid is not actuated and said solenoid moving said rollers so that rollers in each of said pairs are urged against one another when said solenoid is actuated.

* * * * *